(12) United States Patent
Kikuchi et al.

(10) Patent No.: US 7,655,570 B2
(45) Date of Patent: Feb. 2, 2010

(54) ETCHING METHOD, PROGRAM, COMPUTER READABLE STORAGE MEDIUM AND PLASMA PROCESSING APPARATUS

(75) Inventors: Akihiro Kikuchi, Yamanashi (JP);
Yuichiro Sakamoto, Tokyo (JP);
Takashi Tsunoda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 34 days.

(21) Appl. No.: 11/330,336

(22) Filed: Jan. 12, 2006

(65) Prior Publication Data

US 2006/0154472 A1 Jul. 13, 2006

Related U.S. Application Data

(60) Provisional application No. 60/647,033, filed on Jan. 27, 2005.

(30) Foreign Application Priority Data

Jan. 13, 2005 (JP) ............................... 2005-006332

(51) Int. Cl.
*H01L 21/302* (2006.01)
*H01L 21/461* (2006.01)

(52) U.S. Cl. .................. 438/706; 438/714; 438/723
(58) Field of Classification Search ................. None
See application file for complete search history.

(56) References Cited

U.S. PATENT DOCUMENTS

| 5,269,879 | A   |   | 12/1993 | Rhoades et al. |         |
|-----------|-----|---|---------|----------------|---------|
| 6,258,713 | B1  | * | 7/2001  | Yu et al.      | 438/634 |
| 6,316,351 | B1  | * | 11/2001 | Chen et al.    | 438/638 |
| 6,562,720 | B2  | * | 5/2003  | Thilderkvist et al. | 438/695 |
| 6,730,573 | B1  | * | 5/2004  | Ng et al.      | 438/381 |
| 7,018,921 | B2  | * | 3/2006  | Ryu            | 438/637 |

FOREIGN PATENT DOCUMENTS

| JP | 2001-077086 | 3/2001  |
|----|-------------|---------|
| JP | 2001-351974 | 12/2001 |

* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

A difference in etching rate between the coated silicon based insulating film and any of other kinds of silicon-based insulating films is reduced by using nitrogen gas as a part of the etching gas. Therefore, the underlying film may not be exposed to the etching gas for a long time, so that degradation or deterioration of the underlying film can be prevented.

9 Claims, 5 Drawing Sheets

FIG.7
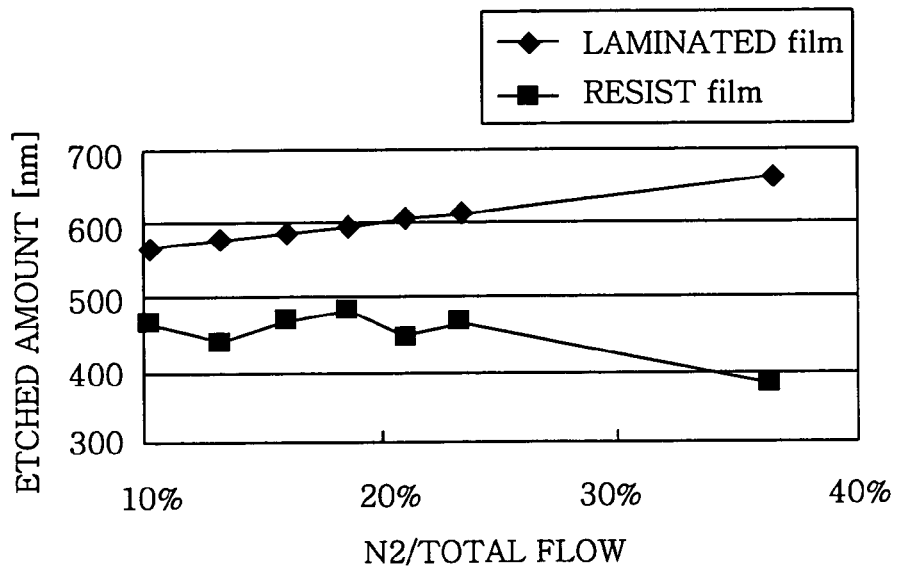
FIG.8
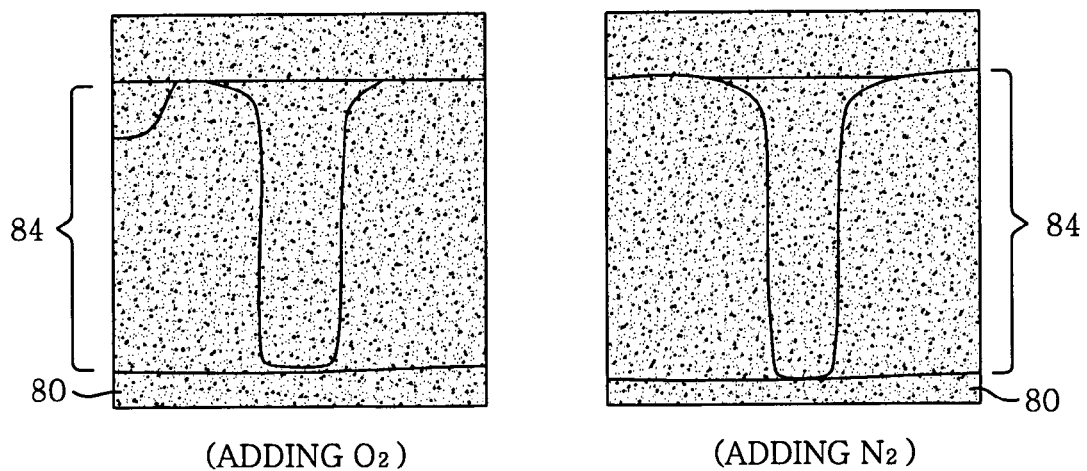
FIG.9
|  | ADDING O$_2$ | ADDING N$_2$ |
|---|---|---|
| TiN film ETCHING SELECTIVITY | 6.2 ~ 8.3 | 16.3 ~ 24.2 |

ETCHING METHOD, PROGRAM, COMPUTER READABLE STORAGE MEDIUM AND PLASMA PROCESSING APPARATUS

FIELD OF THE INVENTION

The present invention relates to an etching method for etching a silicon-based insulating film laminated on a substrate, a program for executing the etching method, a computer readable storage medium containing the program and a plasma processing apparatus for the etching method.

BACKGROUND OF THE INVENTION

In a manufacturing process of an electronic device having a multilayer wiring structure, silicon-based insulating films are laminated on an underlying film of a substrate. Then, multilayer films thus formed by laminating the silicon-based insulating films are etched in a shape of groove or hole. Generally, an etching of the multilayer films is performed on a layer by layer basis starting from a top layer by using an etching gas including a CF (carbon fluoride) based reaction gas. However, to enhance throughput, there has been proposed an etching method, in which the multilayer films are etched in a single step. Further in order to reduce excess carbon, an etching gas in which an $O_2$ gas is added to the CF based reaction gas has been used as well.

However, as shown in FIG. 10 (referring to Japanese patent publication No. 200-235973), a multilayer wiring structure in which a number of Al wirings 100 are out of line in up and down direction can be provided in an electronic device. On an upper part of the Al wiring 100, an underlying film 101, and a laminated film 102 of insulating characteristics are formed thereon in turn, and a resist film R which serves as an etching mask is formed thereon. In this case, a coated insulating film 103, which is formed by a coating method such as SOG (Spin On Glass), is provided in the laminated film 102 as a layer thereof such that influence of sheered Al wirings 100 can be eliminated and a surface of the laminated film 102 can be leveled. The coated insulating film 103 is formed by applying liquid coating material and drying it. The thickness of the coated insulating film varies depending on its location such that the top surface thereof may become flat.

When the laminated film 102 including the coated insulating film 103 whose thickness varies depending on its location is etched by a CF based etching gas to which oxygen gas is added, total etching time of the laminated film 102 is influenced by the thickness of the coated insulating film 103, because an etching rate of the coated insulating film 103 is slower than that of other insulating films 104 and 105. In other words, the etching time of the laminated film 102 at a place where the coated insulating film 103 is very thick differs greatly from that at a place where the coated insulating film 103 is very thin.

Time T needed for the underlying film 101 to be exposed after the etching of the laminated film 102 is started varies greatly depending on the location of each Al wiring 100. Sequentially, while the laminated film 102 is etched, some parts of the underlying film 101 may be exposed to the etching gas for a long time so that the underlying film 101 which is not an etching target is etched to some degree, thereby resulting in it being degraded or deteriorated.

SUMMARY OF THE INVENTION

It is, therefore, an object of the present invention to prevent degradation or deterioration of an underlying film when etching a laminated film including a silicon-based coated insulating film.

In accordance with an aspect of the present invention, there is provided an etching method for etching a laminated film including a plurality of layers of silicon-based insulating films formed on a substrate, wherein the laminated film includes a coated silicon based insulating film formed by a coating method, and the laminated film formed on the substrate is etched by jetting an etching gas containing carbon fluoride based gas and nitrogen gas but oxygen gas into a processing chamber. Here, the silicon-based insulating film is an insulating film including silicon. In the silicon based insulating film, a silicon oxide based insulating film such as $SiO_2$, SiOF, and SiOC containing silicon and oxygen is also included therein.

In accordance with an embodiment of the present invention, by using nitrogen gas as a part of the etching gas, a difference in etching rate between the coated silicon based insulating film and any of other kinds of silicon-based insulating films may be reduced. Accordingly, even though thickness of the coated silicon based insulating film varies depending on its location, time discrepancy in reaching the underlying film from the surface of laminated film because the etching rate ratio of the coated silicon based insulating film to other silicon-based insulating films is relatively increased. Therefore, the underlying film may not be exposed to the etching gas for a long time, so that degradation or deterioration of the underlying film can be prevented. Moreover, the coated silicon based insulating film and other silicon-based insulating films are etched at a same etching rate, so that the etching process can be performed vertically, and thereby etched shape may be improved. Here, the coating method is to apply liquid coating material on the substrate and dry it, thereby forming a film.

Here the coated silicon based insulating film may be an SOG film. The ratio of the etching rate between the coated silicon based insulating film and any of other silicon-based insulating films can be controlled by controlling a supplying amount of nitrogen gas. Thereby, the ratio of the etching rate between the coated insulating film and any of the other insulating films may be optimized, and the laminated film can be etched in a desired shape.

The laminated film may includes a CVD silicon-based insulating film formed by a chemical vapor deposition (CVD) in addition to the coated silicon based insulating film. The CVD silicon-based insulating film may be a silicon oxide film.

The flow rate of nitrogen gas may be controlled to be at 30~40% flow rate of a total flow rate of the etching gas.

Here, the underlying film of the laminated film may be a nitrogen based metal film. In this case, an etching selectivity between the laminated film and the underlying film may be increased. Accordingly, etching of the underlying film is more suppressed, so that damage on the underlying film may be further prevented. Here, the nitrogen-based metal film may be a titanium nitride film.

In accordance with another aspect of the present invention, there is provided a program for executing the above-described etching method on a computer. In accordance with further aspect of the present invention, there is provided a computer readable storage medium containing the program for executing the etching method on a computer. In accordance with further aspect of the present invention, there is provided a plasma processing apparatus including a controller for executing the etching method.

In accordance with the present invention, degradation or deterioration of the underlying film when performing an etching of the laminated film can be suppressed so that quality of device may be improved.

BRIEF DESCRIPTION OF THE DRAWINGS

The above and other objects and features of the present invention will become apparent from the following description of preferred embodiments given in conjunction with the accompanying drawings, in which:

FIG. 7 is a graph illustrating relationships between the flow rate ratio of $N_2$ gas and abrasion of a resist film and that of a laminated film;

FIG. 8 describes two kinds of etched shapes when supplying $O_2$ gas and $N_2$ gas respectively;

FIG. 9 is a table describing an etching selectivity against a titanium nitride film when supplying $O_2$ gas and $N_2$ gas respectively.

DETAILED DESCRIPTION OF THE PREFERRED EMBODIMENTS

Figure 1:
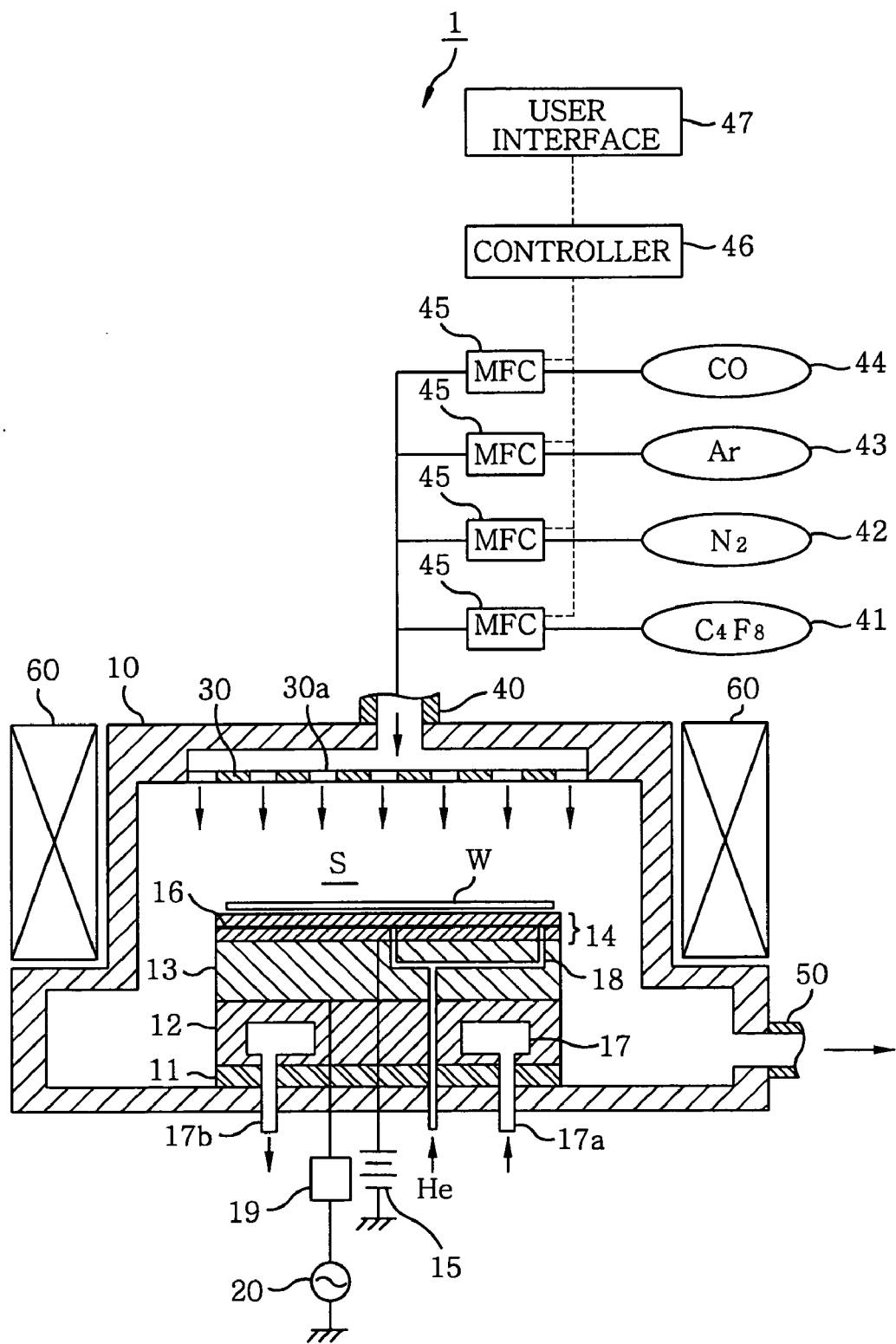
FIG. 1 is a longitudinal cross sectional view of an etching apparatus.

Hereinafter, preferred embodiments of the present invention will be described in detail. FIG. 1 is a longitudinal cross sectional view of an etching apparatus 1.

The etching apparatus 1 includes a cylindrical processing vessel 10. A processing chamber S is formed in an inner space of the processing vessel 10.

The processing vessel 10 is formed of aluminum alloy, and its inner wall surface is covered with an alumina film or an yttrium oxide film.

A suscepter support 12 of a cylindrical shape is installed on a center bottom portion of the processing vessel 10, having an insulating plate 11 therebetween. A suscepter 13 for mounting a substrate W thereon is supported by the suscepter support 12. The suscepter 13 also serves as a lower electrode. Here, the suscepter 13 is formed of, for example, aluminum alloy.

In an upper portion of the suscepter 13, an electrostatic chuck 14 is provided. The electrostatic chuck 14 includes an electrode layer 16 coupled with a DC power supply 15 therein. A coulomb force due to a DC voltage applied from the DC power supply 15 to the electrode layer 16 can be used to adsorb the substrate W on a top surface of the suscepter 13.

A ring-shaped coolant chamber 17 is formed in the suscepter support 12 to communicate with a chiller unit equipped in the exterior of the processing vessel 10 through the lines 17a and 17b. Coolant or cooling water is supplied to be circulated from the coolant chamber 17 through the lines 17a and 17b, so that temperature of the substrate W mounted on the suscepter 13 can be controlled.

A gas supply line 18 passing through the inner sides of the suscepter 13 and the suscepter support 12 reaches to the top surface of the electrostatic chuck 14 such that heat transfer gas such as He gas may be supplied between the substrate W and the electrostatic chuck 14.

The suscepter 13 is electrically coupled with a high frequency power supply 20 through a matching unit 19. The high frequency power supply 20 can output a high frequency voltage of 2 MHz~20 MHz frequency.

Above the suscepter 13, there is provided an upper electrode 30 facing the suscepter 13 in parallel. A plasma generating space is provided between the suscepter 13 and the upper electrode 30.

The upper electrode 30 serves as a part of a shower head for jetting a predetermined etching gas on the substrate W mounted on the suscepter 13 and is of, for example, a round table shape. In the upper electrode 30, a plurality of the gas jetting openings 30a for jetting etching gas into the processing chamber S is formed.

A gas supply line 40 passes through the top surface of the processing vessel 10 to communicate with the gas jetting openings 30a of the upper electrode 30. The gas supply line 40 is divided into a plurality of, for example, four, gas supply sources 41, 42, 43, and 44. In accordance with the present embodiment, for example, $C_4F_8$ gas is encapsulated in the first gas supply source 41, $N_2$ gas is encapsulated in the second gas supply source 42, Ar gas is encapsulated in the third gas supply source 43, and CO gas is encapsulated in the fourth gas supply source 44. A mass flow controller 45 is provided for each gas supply source which communicates with the gas supply line 40 through a corresponding one of branch pipes. Accordingly, gases supplied from the gas supply sources 41~44 can be controlled to be mixed in accordance with a predetermined flow rate ratio, and may be supplied to the processing chamber S. Flow rate control in each mass flow controller 45 is performed by a controller 46 which will be described hereinafter.

Figure 2:
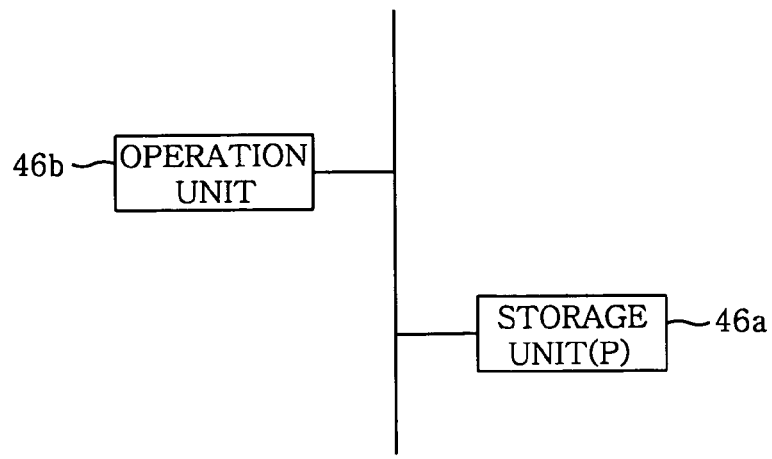
FIG. 2 is a block diagram showing a structure of a device controller.

The etching apparatus 1 includes the controller 46 for controlling various elements for performing an etching process, such as the DC power supply 15, the high frequency power supply 20 and the mass flow controller 45. As shown in FIG. 2, the controller 46 includes a computer, having a storage unit 46a in which a program P for executing the etching process is stored and an operating unit 46b formed with a CPU executing the program P. As shown in FIG. 1, the controller 46 is coupled with a user interface 47 such as a keyboard or a display device. A process manager may manage the etching apparatus 1 by inputting commands through the user interface 47. For example, by using the interface 47, the program P may be installed in the storage unit 46a. The controller 46 may perform a predetermined etching process by controlling the etching apparatus 1 (for example, controlling the mass flow controller 45) in accordance with the program P.

An exhaust pipe 50 communicating with an exhaust device (not shown) such as a vacuum pump is connected to a side of a floor portion of the processing vessel 10. Gas in the processing chamber S is exhausted through the exhaust pipe 50, so that the processing chamber S can be maintained at a desired pressure.

A magnet 60 is provided on the periphery of the processing vessel 10 to generate a horizontal magnetic field in the processing chamber S to make a plasma generated in the processing chamber S be of a high density, thereby improving the etching efficiency.

Figure 3:
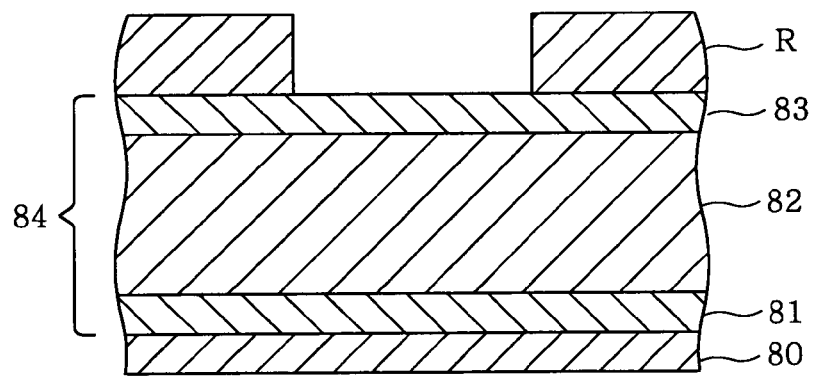
FIG. 3 is a longitudinal cross sectional view of a structure of films formed on a substrate.

Hereinafter, an etching process of the substrate W performed by using the etching apparatus 1 will be described in detail. As shown in FIG. 3, on the substrate W, a titanium nitride film 80 as an underlying film, a TEOS (tetraethoxysilane) film 81 as a CVD silicon-based insulating film, an SOG film 82 as a coated silicon based insulating film, a TEOS film 83 as a CVD insulating film and a resist film R exposed in a specified pattern are laminated sequentially from the bottom. The TEOS films 81 and 83 are $SiO_2$ films (silicon oxide films) formed by using a CVD method with TEOS as raw material. A laminated film 84 is formed of the TEOS film 81, the SOG film 82, and the TEOS film 83. In this etching process, the laminated film 84 is etched from the top surface to a groove in the laminated film 84.

Figure 4:
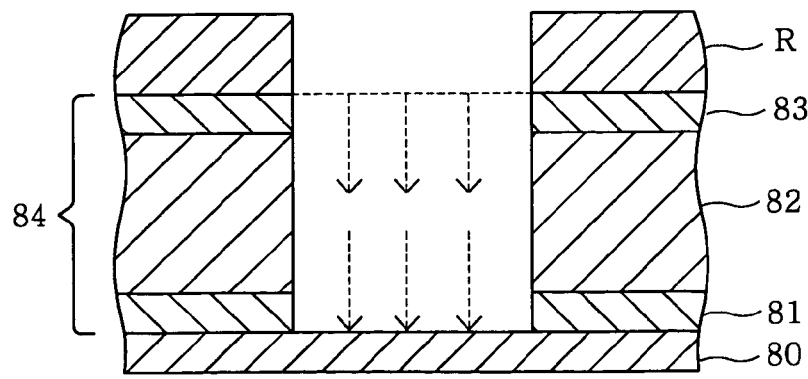
FIG. 4 is a longitudinal cross sectional view of the structure of films after being etched.

Firstly, the substrate W is adsorbed on the suscepter 13 to be held and controlled to be kept at a predetermined temperature thereon. Interior of the processing chamber S is controlled to be maintained at a predetermined pressure by exhausting through the exhaust pipe 50. Through the upper electrode 30, for example, an etching gas including $C_4F_8$ gas, $N_2$ gas, Ar gas and CO gas is supplied into the processing chamber S. Here, for example, the flow rate ratio of $N_2$ gas is controlled to be in a range of 30%~40% of total flow rate of the supplied etching gas. Subsequently, a high frequency power is applied to the suscepter 13 from the high frequency power supply 20, and thereby, the gas in the processing chamber S is converted into a plasma state. Moreover, a magnetic field is formed in the processing chamber S by the magnet forming the horizontal magnetic field, and thereby plasma becomes of high density. As shown in FIG. 4, the laminated film 84 on the substrate W is etched downward from the top surface to form a groove of a concave shape by an action of plasma.

Next in the followings, respective etching rates of the SOG film 82 and the TEOS films 81 and 83 will be examined for a case of etching the laminated film 84 including the SOG film 82 and the TEOS films 81 and 83 with the etching gas including $C_4F_8$ gas and $N_2$ gas as the etching process described above.

Figure 5:
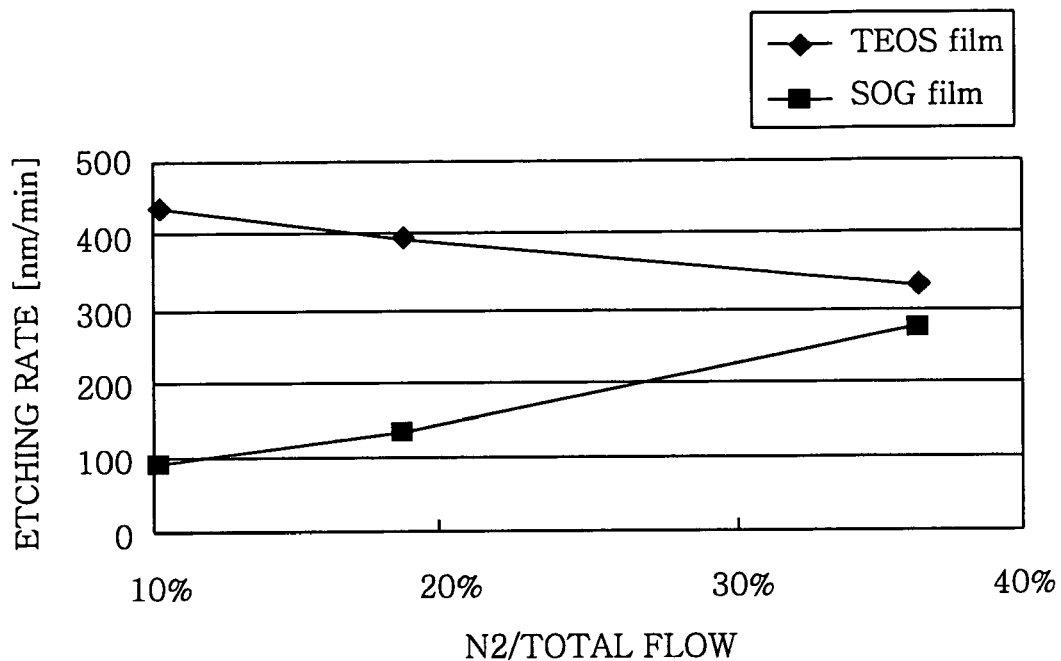
FIG. 5 illustrates a graph showing a relationship between a flow rate ratio of $N_2$ gas and respective etching rates of a SOG film and TEOS film.
Figure 6:
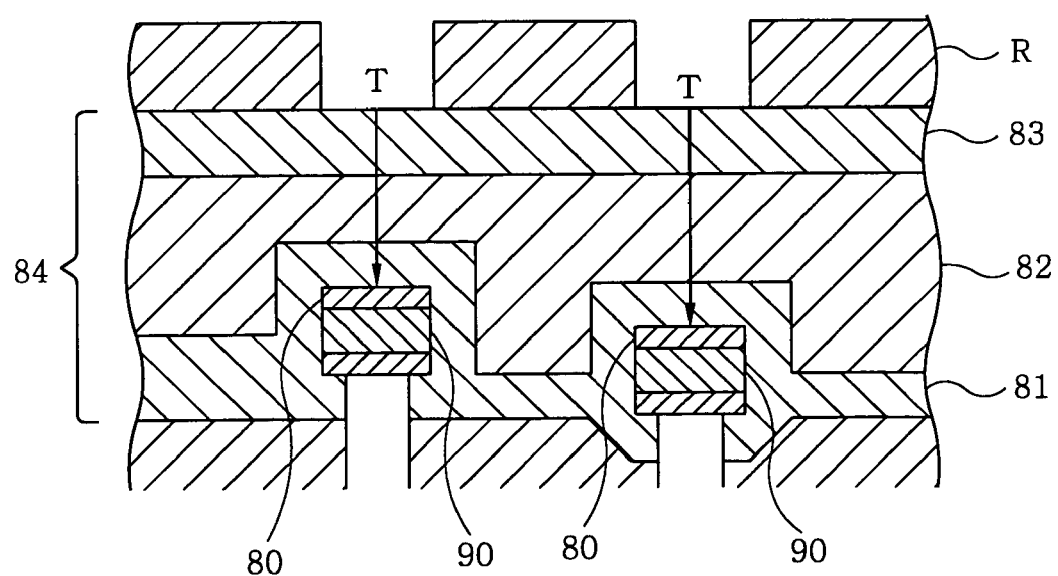
FIG. 6 shows a longitudinal cross sectional view of a film structure in which an underlying film has prominence and depression.
Figure 10:
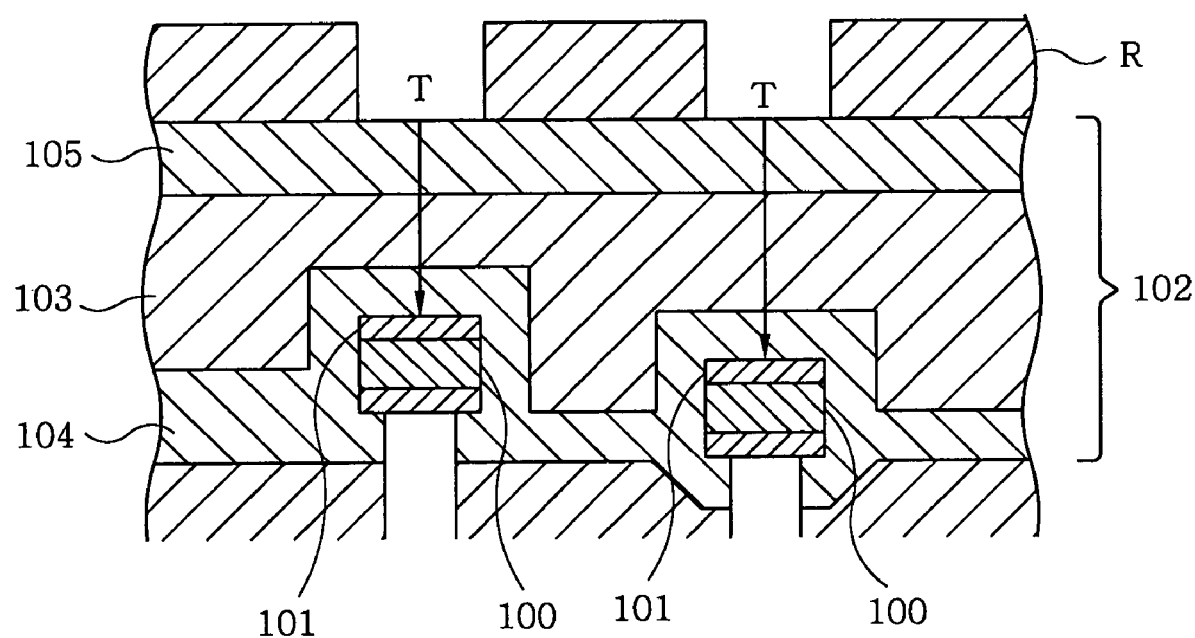
FIG. 10 is a longitudinal cross sectional view of a film structure for explaining difference in time needed to reach an underlying film.

FIG. 5 is an experimental data graph showing a relationship between the flow rate ratio of N2 gas to the total flow rate of the etching gas and the respective etching rates of the SOG film 82, and TEOS films 81 and 83. This experiment was performed under a condition of processing pressure: 3.99 Pa (30 mT), high frequency power: 1300 W, flow rate of C4F8/CO/Ar: 12/50/200 cm3/min, and substrate temperature: 20° C. From FIG. 5, it can be understood that the respective etching rates of the SOG film 82 and the TEOS films 81 and 83 vary as a function of the flow rate ratio of N2 gas, and the etching rate of the SOG film 82 and the etching rate of the TEOS films 81 and 83 become close to each other when the flow rate ratio of N2 gas becomes in a range of 30%~40%. For example, it can be found out that an etching rate ratio (SOG film/TEOS film) between the etching rate of the SOG film 82 and that of the TEOS films 81 and 83 becomes larger than 0.6~0.8 when the flow rate ratio of N2 gas is in the range of 30%~40%. As described above, the respective etching rates of the SOG film 82 and the TEOS films 81 and 83 can be controlled to become close to each other by controlling the flow rate ratio of N2 gas. Therefore, an etched shape of the laminated film may be improved. For example, in FIG. 6, a number of Al wirings 90 of different heights are formed, and the titanium nitride film 80 as an underlying film, the TEOS film 81, the SOG film 82 of different thicknesses depending on respective locations and the TEOS film 83 are sequentially formed upon each Al wiring 90. Even in this case, etching of the SOG film 82 is performed at a same etching rate as that of the TEOS film 81. Therefore, a time difference of etching time T needed to reach the titanium nitride film 80 of each Al wiring 90 from the surface of the laminated film 84 may be reduced. Consequently, no part of the titanium nitride film 80 will be exposed to the etching gas for an excessively long time so that degradation or deterioration of the titanium nitride film 80 can be prevented. Here, the multi layered film structure shown in FIG. 6 is an example for an easier understanding, and an actual structure can be different from that shown in FIG. 6.

From FIG. 7, it can be also confirmed that etching selectivity of the laminated film 84 to the resist film R is increased by raising the flow rate ratio of $N_2$ gas. Accordingly, abrasion of the resist film R may be prevented.

Next, the etching selectivity of the laminated film 84 and the titanium nitride film 80 will be examined in case of adding $N_2$ gas to the etching gas as in the etching process described above. FIG. 8 describes two kinds of etched shapes when supplying $O_2$ gas and $N_2$ gas respectively. FIG. 9 is a table describing an etching selectivity against a titanium nitride film (etching rate of the laminated film/etching rate of the titanium nitride) when supplying $O_2$ gas and $N_2$ gas respectively. This experiment was performed under a condition of, processing pressure: 3.99 Pa (30 mT), high frequency power: 1300 W, flow rate of $C_4F_8$/CO/Ar/$O_2$: 10/100/200/9 $cm^3$/min, flow rate of $C_4F_8$/CO/Ar/$N_2$: 12/50/200/60 $cm_3$/min, and substrate temperature: 20° C. As shown in FIG. 9, it can be confirmed that the case of adding $N_2$ gas has a prominently higher etching selectivity of the laminated film to the titanium nitride film than the case of adding $O_2$ gas. Therefore, by adding N2 gas instead of $O_2$ gas to the etching gas, abrasion of the titanium nitride film 80 by the etching gas can be more effectively prevented. Moreover, as shown in FIG. 8, it can be also confirmed that a bowing phenomenon is reduced and etched shape is improved when $N_2$ gas is added in comparison with the case of adding $O_2$ gas.

While embodiments of the present invention have been described in the above, the present invention will not be limited thereto. Various modifications and equivalent arrangements may be adopted. For example, though in the embodiment described above, laminated film 84 is a three-layers film in which the TEOS film 81, the SOG film 82, and the TEOS film 83 are sequentially laminated from the bottom, the present invention may be also applied to a laminated film having different number of layers in which at least one SOG film is included. The SOG film 82 in the laminated film 84 may be other kinds of coated silicon based insulating film, for example, a Low-k film (low permittivity film) such as a HSQ film or a SILK (registered mark of Dow chemical). The TEOS films 81 and 83 in the laminated film 84 may be other kinds of CVD film, for example, a Low-k film such as HTO, BPSG, BSG, PSG, SIOC, and SIOF, etc. The silicon-based insulating films other than the SOG film 82 can be formed by film forming methods other than the CVD method, for example, sputtering method and thermal oxidation method, etc. The titanium nitride film 80 can be other kinds of nitrogen based metal film, for example, TaN film. The carbon fluoride based gas which is supplied as a reaction gas is not limited to $C_4F_8$, but it can be other kinds of carbon fluoride based gas such as $CF_4$, $CHF_3$, $C_2F_6$, and $CH_2F_2$, etc. depending on the material to be etched. The present invention may be applied in etching substrates of a semiconductor wafer, a FPD (flat panel display), and a mask reticle used for photo mask.

While the invention has been shown and described with respect to the preferred embodiments, it will be understood by those skilled in the art that various changes and modifications may be made without departing from the scope of the invention as defined in the following claims.

What is claimed is:

1. An etching method for etching a laminated film having a plurality of layers of silicon-based insulating films formed on a substrate, the silicon-based insulating films including in sequence a first tetraethoxysilane (TEOS) film, a spin-on glass (SOG) film, and a second TEOS film, the etching method comprising:
    etching the laminated film formed on the substrate by introducing an etching gas into a processing chamber, the etching gas containing a carbon fluoride gas and a nitrogen gas but being essentially devoid of an oxygen gas; and
    making etching rates of the SOG film and those of the first and second TEOS films substantially identical to each other by setting a ratio of a flow rate of the nitrogen gas to a total flow rate of the etching gas to be about 30%-40%.

2. The etching method of claim 1, wherein an etching rate ratio of the SOG film to said fist and second TEOS films is controlled by adjusting the flow rate of the nitrogen gas being introduced.

3. The etching method of claim 1, wherein said first and second TEOS films are formed by chemical vapor deposition (CVD).

4. The etching method of claim 1, wherein an underlying film of the laminated film is a nitrogen based metallic film.

5. The etching method of claim 4, wherein the nitrogen based metallic film is a titanium nitride film.

6. An etching method for etching a laminated film having a first tetraethoxysilane (TEOS) film, a spin-on glass (SOG) film, and a second TEOS film formed on a substrate, comprising:
    etching the laminated film formed on the substrate by introducing an etching gas into a processing chamber, the etching gas containing a carbon fluoride gas and a nitrogen gas; and
    making etching rates of the first and second TEOS films and the SOG film substantially identical to each other by setting a ratio of a flow rate of the nitrogen gas to a total flow rate of the etching gas to be about 30%-40%.

7. The etching method of claim 6, wherein an etching rate ratio of the first and second TEOS films to the SOG film is controlled by adjusting the flow rate of the nitrogen gas being introduced.

8. The etching method of claim 6, wherein the first and second TEOS films are formed by chemical vapor deposition (CVD).

9. The etching method of claim 6, wherein an underlying film of the laminated film is a nitrogen based metallic film.

* * * * *